United States Patent
Deimling

(10) Patent No.: US 6,404,195 B1
(45) Date of Patent: Jun. 11, 2002

(54) APPARATUS AND PULSE SEQUENCE METHOD FOR MR TOMOGRAPHY

(75) Inventor: Michael Deimling, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/610,947

(22) Filed: Jul. 6, 2000

(30) Foreign Application Priority Data

Jul. 7, 1999 (DE) .......................................... 199 31 292

(51) Int. Cl.[7] .................................................. G01V 3/00
(52) U.S. Cl. ........................ 324/308; 324/309; 324/307
(58) Field of Search ................................ 324/309, 307, 324/312, 314, 300, 308

(56) References Cited

U.S. PATENT DOCUMENTS

| | | | |
|---|---|---|---|
| 4,769,603 A | 9/1988 | Oppelt et al. | 324/309 |
| 5,541,514 A | 7/1996 | Heid et al. | 324/309 |
| 5,923,168 A | 7/1999 | Zhou et al. | 324/309 |
| 6,064,205 A | 5/2000 | Zhou et al. | 324/307 |
| 6,198,287 B1 | 3/2001 | Heiserholt et al. | 324/322 |

FOREIGN PATENT DOCUMENTS

DE OS 197 22 221 12/1998

OTHER PUBLICATIONS

"Bildgebende Sequenzen in der Kernspin–tomographie und ihre klinische Anwendung," Nitz, electrometica 64, vol. 1, (1996), pp. 23–29 Eng. Translation Not Provided Not Considered.

"Halving MR Imaging Time by Conjugation: Demonstration at 3.5 kG," Feinberg et al, Radiology vol. 61 (1986), pp. 527–531.

*Primary Examiner*—Edward Lefkowitz
*Assistant Examiner*—Brij B. Shrivastav
(74) *Attorney, Agent, or Firm*—Schiff Hardin & Waite

(57) ABSTRACT

In a magnetic resonance tomography apparatus, and a pulse sequence for operating the apparatus, a radio frequency pulse, having a flip angle of $\alpha/2$ is emitted into a subject in a first pulse sequence section, by second and third pulse sequence sections in which a sequence of radio frequency pulses is emitted, each having a flip angle $\alpha$ and a repetition time which is lower than the T1 and T2 relaxation times of the subject, the subject eventually reaching a steady state equilibrium condition after which the third pulse sequence section begins. In the third pulse sequence section, magnetic signals are read out from the subject with a phase coding, the phase coding being reset before the next radio frequency pulse in the sequence. The magnetic resonance signals are entered into a k-space matrix sorted according to the phase coding phase factors, and the phase coding is conducted in the third pulse sequence section so that the magnetic resonance signals for the central rows of the k-space matrix are acquired at the beginning of the third pulse sequence section.

7 Claims, 4 Drawing Sheets

1st PREP. (α/2) +
m α PREPARATIONS +
k α EXCITATIONS

1st PREP. (α/2) +
m α PREPARATIONS +
k/2 α EXCITATIONS

APPARATUS AND PULSE SEQUENCE METHOD FOR MR TOMOGRAPHY

BACKGROUND OF THE INVENTION

1. Field of the Invention

The present invention is directed to a method, in the form of a pulse sequence, for operating a magnetic resonance (MR) tomography apparatus, as well as to a magnetic resonance tomography apparatus operating according to the pulse sequence method.

2. Description of the Prior Art

A so-called "steady state" pulse sequence that is usually referred to with the acronym "FISP" is disclosed in detail, for example, in U.S. Pat. No. 4,769,603. This pulse sequence is distinguished by a high spatial resolution, a short measuring time (in the seconds range per slice) and by a high signal-to-noise ratio for tissue having fluid consistency. This is particularly true of the sequence version referred to as "TRUE FISP" wherein the gradients in all directions are reset after each read out phase before the next-successive excitation pulse. The signal of the FISP sequence is essentially determined by the ratio T1/T2 of the relaxation times T1 and T2. The nuclear magnetic resonance signal becomes higher as this ratio becomes smaller. Given a high excitation angle α of, for example, 90°, the nuclear magnetic resonance signals derive from the initial magnetization M0 according to the following equation:

$$S \approx M0/(1+T1/T2)$$

This signal, however, occurs only after many excitation cycles dependent on the excitation angle α and on the ratio T1/T2. Soft tissue such as, for example, muscle with T1=600 ms and T2=50 ms has a relatively high ratio T1/T2=12 and therefore appears with relatively low intensity in the FISP image. In contrast thereto, fat has a relatively low T1/T2 ratio of approximately 270 ms:70 ms=3.85. In the steady state, fat therefore yields a very high signal intensity. This is particularly disturbing because fat is typically not the subject of the examination.

As already mentioned, the aforementioned signal intensity is only valid in the dynamic equilibrium condition, i.e. only after many excitation cycles. Until then, the signal intensity undergoes pronounced oscillations that last for a major part of the measuring time without further measures. In this time span, the nuclear magnetic resonance signals cannot be used for the imaging since they would lead to pronounced artifacts in the phase-coding direction during the transient event.

The oscillations of the magnetization, and thus of the nuclear magnetic resonance signal, can be largely avoided when, as disclosed in U.S. Pat. No. 5,541,514, the pulse sequence is preceded by a radio frequency pulse in the form of an α/2 pulse, i.e. a radio frequency excitation pulse having half the flip angle of the following radio-frequency excitation pulses. The nuclear magnetic resonance signals that arise thus can be used for the imaging from the very start. In the conventional type of phase coding that proceeds from the highest negative value through zero to the highest positive value, however, this does not change anything with respect to the high signal intensity of spectral components having a low T1/T2 ratio. The image contrast is mainly determined by the middle (central) k-space rows, as is known, for example, from the article by W. Nitz: "Bildgebende Sequenzen in der Kernspintomographie und ihre klinische Anwendung", which appeared in electromedica 64 (1996), No. 1, pages 23 through 29. Since data in these rows are only acquired in the middle of the overall measurement, i.e. after many preceding excitations, the steady state condition having a high signal intensity of fat has already been reached.

The article by David A. Feinberg et al., "Halving MR Imaging Time by Conjugation: Demonstration at 3, 5 kG", Radiology 1986, Vol. 161, pages 527–531, discloses a method for reducing the image data acquisition. To that end, only one half of the k-space is filled with raw image data acquired from the subject; the other half of the k-space is filled with synthetic data that, due to their symmetry, can be determined from the measured data.

SUMMARY OF THE INVENTION

An object of the present invention is to modify a pulse sequence of the FISP type such that the high signal intensity of undesired spectral components is avoided and to provide an MR apparatus that can be operated with such a pulse sequence.

These objects are inventively achieved in an MR pulse sequence and in an MR apparatus wherein the central area of k-space are already measured shortly after the beginning of the sequence when an equilibrium condition of the magnetization has not yet occurred. In this condition before reaching equilibrium, nearly all diagnostically relevant tissue exhibits a higher magnetization than in the equilibrium condition, whereas the magnetization of undesired spectral components, for example fat-bound protons, still oscillates and exhibits no significant super-elevations compared to the steady state.

In the inventive pulse sequence and in the MR tomography apparatus operated according to the sequence, in a first pulse sequence section, a radio frequency pulse with a flip angle of α/2 is emitted into an examination subject. In second and third pulse sequence sections, a sequence of radio frequency pulses each having a flip angle α is emitted, with a repetition time that is lower than the T1 and T2 relaxation times of the examination subject. The third pulse sequence section begins before the steady state equilibrium condition in the subject is reached. In the third pulse sequence section, magnetic resonance signals are read out with phase coding after each radio frequency pulse, with the phase coding being reset before the next-following radio frequency pulse is emitted. The magnetic resonance signals acquired in this manner are entered into a k-space matrix sorted according to phase factors. The phase coding ensues such that in the third pulse sequence section, the central rows of the k matrix are acquired at the beginning of the third pulse sequence section.

Advantageously, the amplitude of the phase-coding gradient rises linearly in the third pulse sequence section. When the direction of the phase-coding gradient thereby changes from repetition to repetition, data are entered proceeding from the center of the k-space toward the edges of the k-space in both directions. Alternatively, data for only half the k-space can be obtained since this fundamentally contains all of the information required for the image reconstruction.

In an embodiment, the number of radio frequency pulses in the second pulse sequence section is selected such that the signal amplitude of nuclear magnetic resonance signals of unwanted spectral components has a minimum at the beginning of the third sequence section. This embodiment utilizes the fact that the magnetization of the undesired spectral components still oscillates in this region. When the beginning of the measurement, i.e. the measurement of the k-space center, is timed such that the magnetization of the unwanted spectral components happens to exhibit a minimum, this spectral component is optimally suppressed in the image.

DESCRIPTION OF THE PREFERRED EMBODIMENTS

Figure 1:
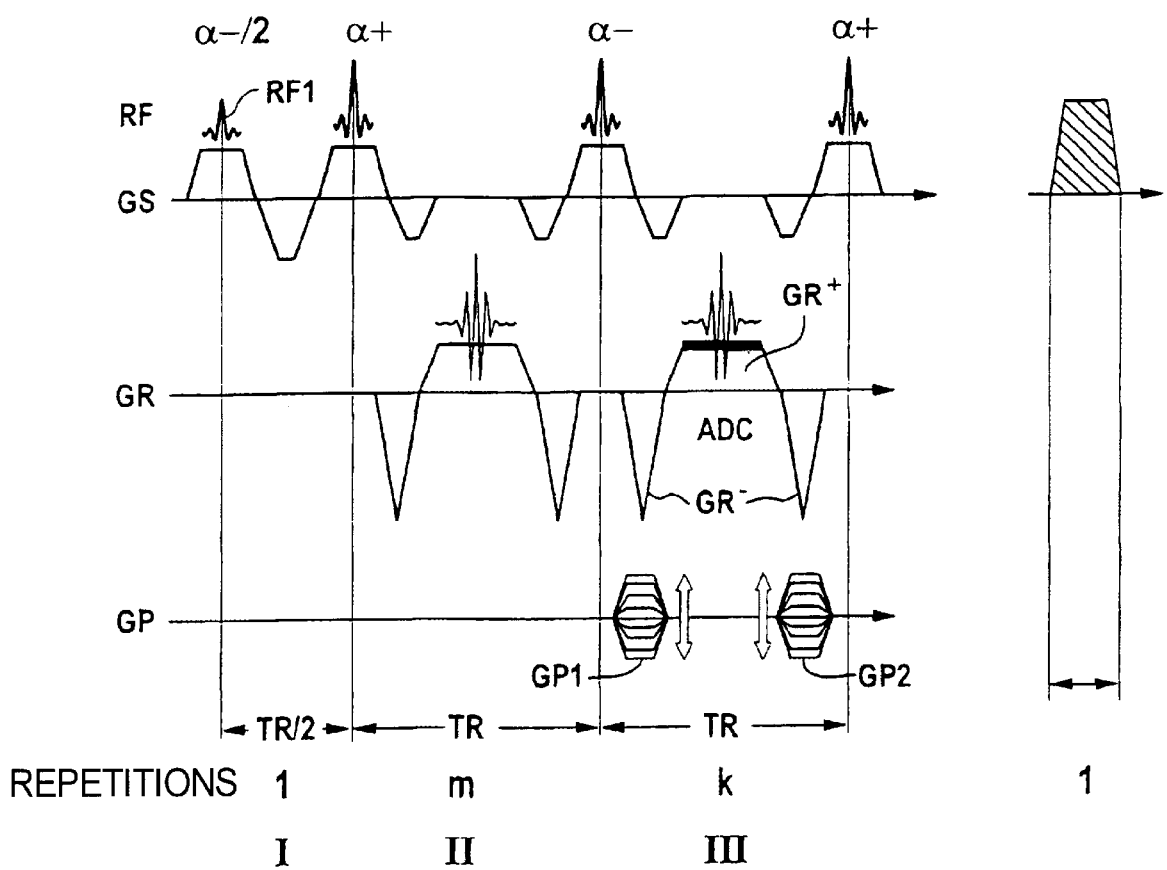
FIG. 1 illustrates a pulse sequence as exemplary embodiment of the invention.

The pulse sequence of FIG. 1, as an exemplary embodiment of the invention, is divided into three sequence sections I, II and III. The pulse sequence begins with the pulse sequence section I with a single radio frequency pulse having the flip angle $\alpha/2$. In the following pulse sequence section II, radio frequency pulses with a flip angle $\alpha$ and alternating operational sign (indicated in FIG. 1 by the addition of the operational sign to the flip angle $\alpha$) are emitted in with a repetition time TR. The first radio frequency pulse of the second pulse sequence section II has a time spacing TR/2 relative to the radio frequency pulse RF1 in the first pulse sequence section and exhibits the opposite operational sign from this radio frequency pulse. In the pulse sequence section II, m repetitions ensue where m is an even number. Although nuclear magnetic resonance signals thereby arise, these are not read out.

The application of radio frequency pulses RF with the flip angle $\alpha$ and alternating operational sign likewise ensues with a repetition time TR in a following pulse sequence section III. Here, however, a phase-coding gradient GP1 is activated before each radio frequency signal, with the phase rotation thereby caused being in turn reset by a phase-coding gradient GP2 with the opposite operational sign following the nuclear magnetic resonance signal. A nuclear magnetic resonance signal S is read out and phase-dependently sampled under a positive read out gradient pulse $GR^+$. Respective negative gradient pulses $GR^-$ precede and follow this read out gradient pulse $GR^+$. The gradient-time areas of these individual gradient pulses are dimensioned such that the total area sums to zero viewed over a sequence repetition.

The radio frequency pulses RF are respectively emitted in under a slice selection gradient GS. Each slice selection gradient GS is preceded and followed by a negative subpulse, whereby the total of the gradient-time areas of these individual pulses also yield zero for each repetition. A gradient-time integral of zero in all three gradient directions and for each sequence repetition is a typical characteristic of the TRUE FISP sequence.

In the pulse sequence section III, k sequence repetitions are implemented, i.e. k nuclear magnetic resonance signals are acquired. Typically, k is selected such that a complete slice of the examination subject can be scanned therewith. The number k of the sequence repetitions in the pulse sequence section III is thereby significantly higher than the number of sequence repetitions in the pulse sequence section II. In most applications, there will not be a limitation to the scanning of an individual slice; rather, a number of successive slices will be scanned. Given the excitation in one slice, co-excitation of neighboring slices even to a significantly lesser extent, can not be completely prevented. In order to prevent signal falsifications from arising in a slice to be newly excited due to the prior history in the neighboring slices, a spoiler gradient pulse GSS can be activated after the measurement of a complete slice, as shown in FIG. 1. This pulse is so high in amplitude that it destroys any remaining phase coherency in the previously excited spins, so that these cannot produce any signals in the slice to be newly measured.

As is generally standard, the samples of the nuclear magnetic resonance signals are digitized, demodulated in phase-dependent fashion and entered row-by-row into a k-space matrix, sorted according to phase factors. The row position kp is thereby defined by the gradient-time area of the preceding phase-coding gradient GP. The way in which the phase-coding gradient is activated thus defines the sequence of the ordering (entry) into the k-space matrix. It is important for the present method that the measurement begins with the zero row, or at least with a low row number of the k-space matrix.

Figure 2:
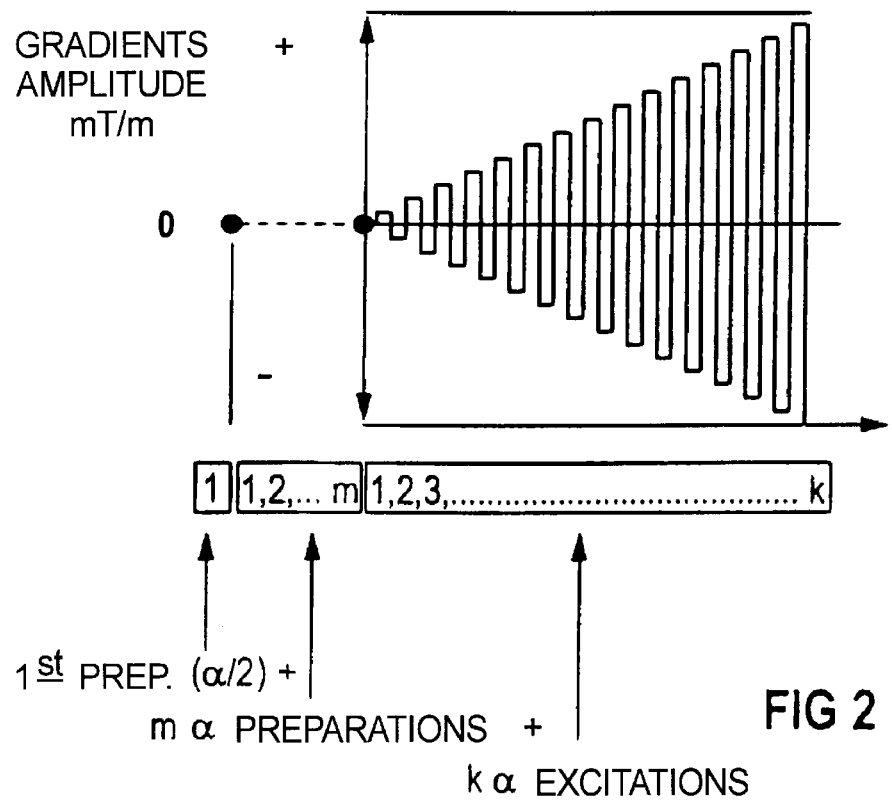
FIG. 2 shows a first example of the phase-coding steps suitable for use in the invention.

FIG. 2 shows a first embodiment of the curve of the phase-coding gradient GP, namely the curve of the amplitude of the phase-coding gradient GP over the continuing excitations. It can be seen that the occupancy of the k-space matrix, beginning from the center, proceeds alternately in positive and negative directions toward the edges with ongoing excitation. The number k of excitations, or sequence repetitions, is equal to the number of rows of the k-space matrix.

Figure 3:
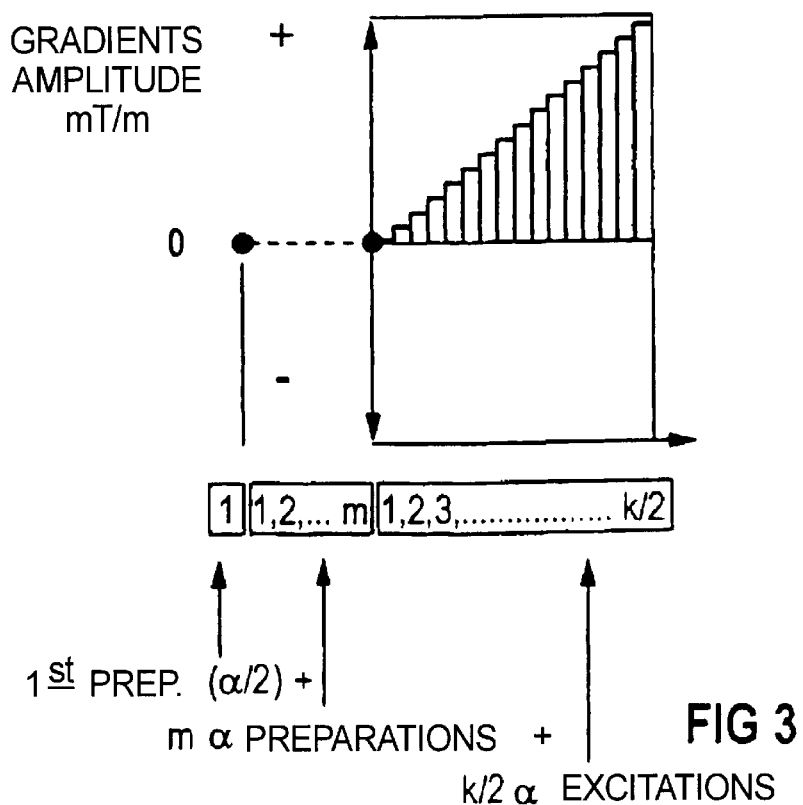
FIG. 3 shows a second example of the phase-coding steps suitable for use in the invention.

A second exemplary embodiment for the curve of the phase-coding gradient is shown in FIG. 3. Here, only half the k-space is sampled, i.e. only half as many nuclear magnetic resonance signals need be acquired. This is possible because—at least in the ideal case—each k-space matrix is conjugate-symmetrical and the half of the k-space therefore contains the full information for the image acquisition. In this case, a change in polarity is not required for the phase-coding gradient GP; rather, beginning from zero, this is incremented step-by-step with every excitation.

With this type of phase coding, i.e. the ordering of the measured values into the k-space matrix, the signal of the water-bound protons is required before these proceed into the equilibrium condition. The transverse magnetization Ny, and thus the MR signal to be achieved, is thus significantly higher than in the equilibrium condition. This is explained in greater detail below with reference to FIGS. 4 through 6.

Figure 4:
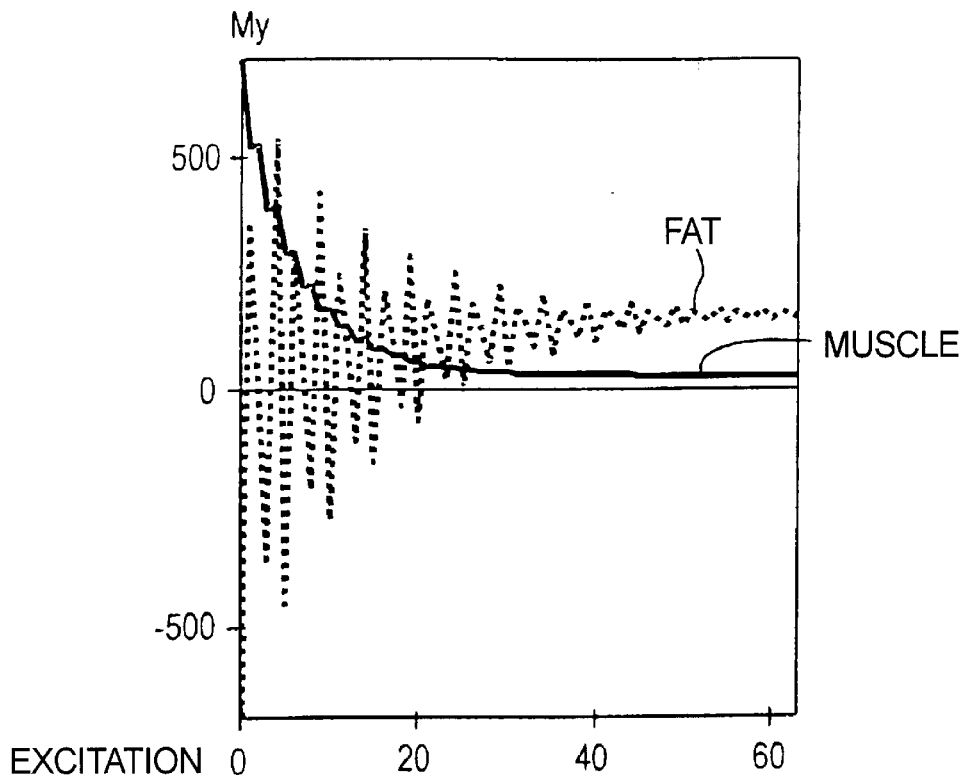
FIG. 4 is a simulation of the magnetization of fat and water for the (hypothetical) case of a single fat component.
Figure 5:
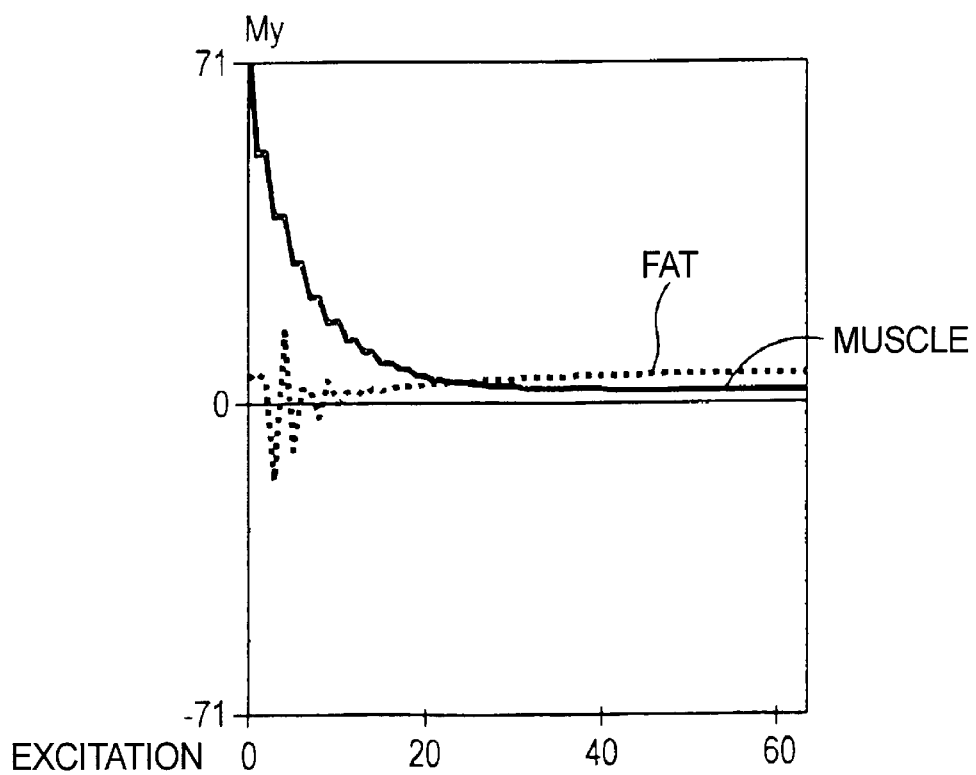
FIG. 5 is a simulation of the magnetization of fat and water for the more realistic case of ten fat components.

FIG. 4 shows a simulation of the transverse magnetization My over the excitations. The transverse magnetization of the water-bound protons is thereby indicated with a solid line. It can be seen that the magnetization drops from a high level to a relatively low level in the equilibrium condition. This uniformity of the transition into the steady state condition is achieved by the preceding excitation pulse with the flip angle $\alpha/2$ The transverse magnetization My of a fat component illustrated with dotted lines, however, oscillates highly until the transition into the equilibrium condition. In practice, however, a number of fat components always occurs, so that the simulation with ten fat components shown in FIG. 5 comes closer to reality. The fat signal is thereby clearly lower in the transient condition and proceeds faster into an equilibrium condition.

Figure 6:
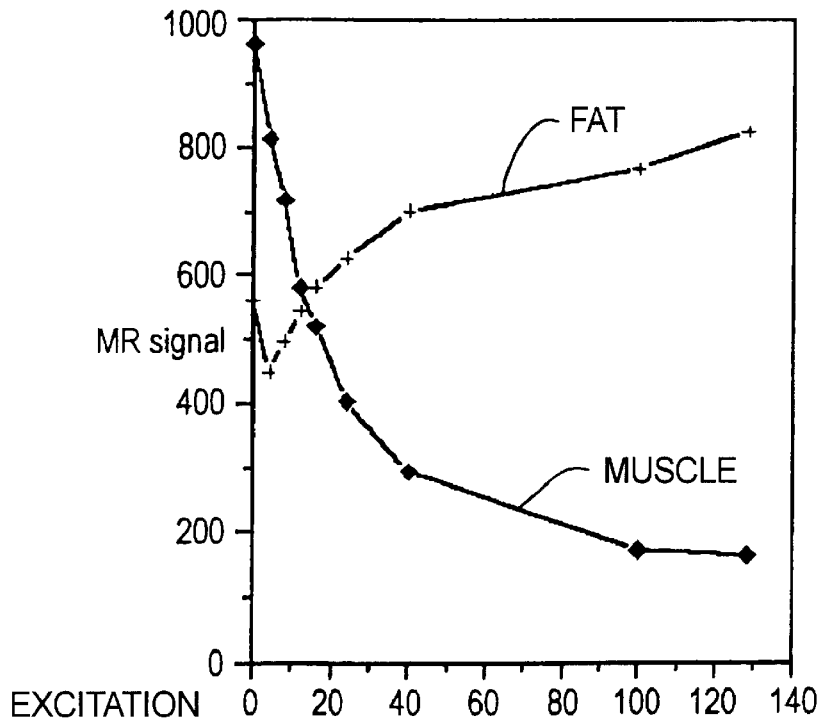
FIG. 6 shows the actually measured MR signal dependent on the excitation as is obtained in accordance with the invention.

FIG. 6 shows actually measured signals for fat and water components in the MR signal. It can be seen that the signal intensity for water components in the transient condition is clearly higher than in the equilibrium condition, whereas the fat signal behaves oppositely. When, in conformity with the invention, the contrast-defining middle k-space rows are therefore utilized in the transient event, the disturbing emphasis of the fat components in the image is largely eliminated. Yet another important perception, however, can also be derived from FIG. 6, namely that the fat signal drops after a few excitations and then rises again. The fat emphasis in the image thus can be reduced best by obtaining the data for the zero row of the k-space exactly when the fat signal exhibits a minimum. In the second pulse sequence section II wherein no MR signals are measured, so many even-numbered excitations are therefore implemented that the fat signal has a minimum at the beginning of the pulse sequence section III at which the zero row of the k-space is measured.

With the inventive pulse sequence, thus, the high fat signal, that is currently a disturbing factor in FISP images, is significantly reduced. For most water tissue types, however, the signal becomes higher, so that the signal-to-noise ratio is improved practically without extra outlay.

Figure 7:
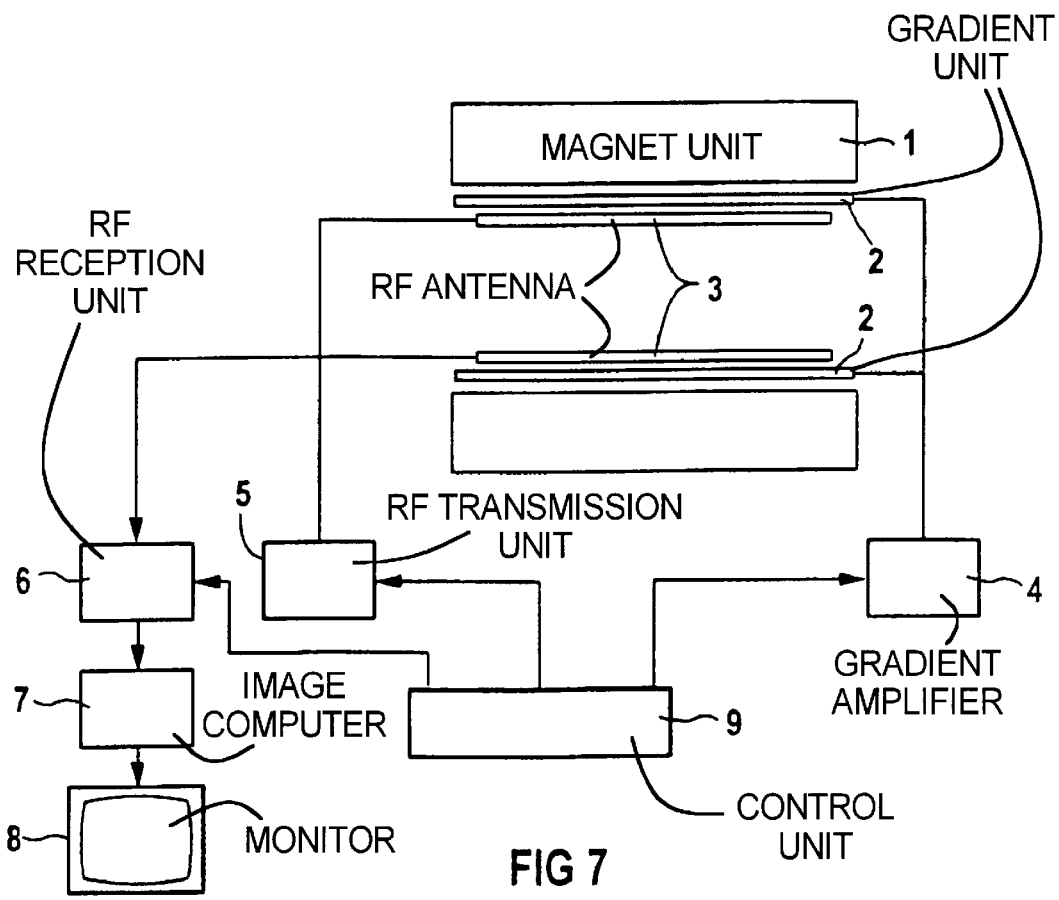
FIG. 7 is a schematic illustration of an inventive MR apparatus for the implementation of the inventive method.

FIG. 7 schematically shows an MR apparatus for the implementation of the method. The examination subject thereby lies in a magnet unit 1 in which a gradient unit 2 and a radio frequency antenna 3 are installed. The gradient unit 2 is driven by a gradient amplifier 4; radio frequency signals are transmitted as well as received with the antenna 3. The antenna 3 is connected to a radio frequency transmission unit 5 and to a radio frequency reception unit 6. The radio frequency reception unit 6 is followed by an image computer 7 that reconstructs the received signals and displays them on a monitor 8. The radio frequency transmission and reception units 5, 6 as well as the gradient amplifier 4 are driven by a control unit 9 that controls the curve of the gradient current and the transmission and reception phases according to the above-presented pulse sequence.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method comprising a pulse sequence for operating a magnetic resonance tomography apparatus, comprising the steps of:

in a first pulse sequence section, emitting a radio frequency pulse having a flip angle of $\alpha/2$ into a subject;

in a second pulse sequence section and a third pulse sequence section, following in succession after said first pulse sequence section, emitting a sequence of radio frequency pulses each having a flip angle a and with a repetition time which is lower than a T1 relaxation time and a T2 relation time of said subject, said subject eventually reaching a steady state equilibrium condition and said third pulse sequence section beginning before said steady state equilibrium condition occurs;

in said third pulse sequence section, reading out magnetic resonance signals from said subject with a phase coding, by applying a phase coding gradient, thereby giving each magnetic resonance signal a phase factor, after each radio frequency pulse in said sequence of radio frequency pulses, and resetting said phase coding before a radio frequency pulse next in succession in said sequence of radio frequency pulses; and entering said magnetic resonance signals into a k-space matrix sorted according to phase factors, said k space matrix having a plurality of rows, including central rows, and said phase coding being conducted in said third pulse sequence section so that magnetic resonance signals for said central rows of said k space matrix are acquired at a beginning of said third pulse sequence section.

2. A method as claimed in claim 1 comprising conducting said phase coding by applying a phase coding gradient which increases linearly in said third pulse sequence section.

3. A method as claimed in claim 2 comprising alternating a direction of said phase coding gradient from repetition to repetition.

4. A method as claimed in claim 2 comprising sampling said magnetic resonance signals for only one-half of said k space matrix.

5. A method as claimed in claim 1 comprising selecting said sequence of radio frequency pulses and said second pulse sequence section so that a signal amplitude of the magnetic resonance signals having an undesired spectral component exhibits a minimum at said beginning of said third pulse sequence section.

6. A method as claimed in claim 1 comprising slice selectively emitting said radio frequency pulses and generating a gradient spoiler pulse after any change in the slice which is excited by said radio frequency pulses.

7. In a magnetic resonance tomography apparatus having a radio frequency emitter, a gradient coil system and a controller which operates said radio frequency emitted and said gradient coil system, and a memory, the improvement comprising:

in a first pulse sequence section, said controller causing said radio frequency emitter to emit a radio frequency pulse having a flip angle of $\alpha/2$ into a subject;

in a second pulse sequence section and a third pulse sequence section, following in succession after said first pulse sequence section, said controller causing said radio frequency emitter to emit a sequence of radio frequency pulses each having a flip angle a and with a repetition time which is lower than all relaxation time and a T2 relation time of said subject, said subject eventually reaching a steady state equilibrium condition and said third pulse sequence section beginning before said steady state equilibrium condition occurs;

in said third pulse sequence section, said controller operating said gradient coil system to emit a readout gradient and a phase coding gradient for reading out magnetic resonance signals from said subject with a phase coding, thereby giving each magnetic resonance signal a phase factor, after each radio frequency pulse in said sequence of radio frequency pulses, and for emitting a gradient pulse for resetting said phase coding before a next-following radio frequency pulse in said sequence of radio frequency pulses; and said controller entering said magnetic resonance signals into a k-space matrix in said memory sorted according to phase factors, said k-space matrix having a plurality of rows, including central rows, and said phase coding being conducted in said third pulse sequence section so that magnetic resonance signals for said central rows of said k space matrix are acquired at a beginning of said third pulse sequence section.

* * * * *